United States Patent

Frechette et al.

[11] Patent Number: 5,252,361
[45] Date of Patent: Oct. 12, 1993

[54] PROTECTIVE COATING FOR NON-OXIDE SINTERED FIBERS GENERATED BY IN SITU CHEMICAL REACTION

[75] Inventors: Francis J. Frechette, Tonawanda; Wolfgang D. G. Boecker, Lewiston, both of N.Y.

[73] Assignee: The Carborundum Company, Niagara Falls, N.Y.

[21] Appl. No.: 467,592

[22] Filed: Jan. 19, 1990

[51] Int. Cl.⁵ ............................................. C23C 16/00
[52] U.S. Cl. .............................. 427/255.3; 427/255.2; 427/255.1; 427/255; 427/248.1; 427/314
[58] Field of Search ............... 427/255.1, 255.2, 255.3, 427/314, 255.4, 248.1, 255

[56] References Cited

U.S. PATENT DOCUMENTS

| | | | |
|---|---|---|---|
| 3,811,928 | 5/1974 | Henney et al. | 117/106 |
| 3,849,181 | 11/1974 | Grear | 117/106 |
| 4,580,524 | 4/1986 | Lackey, Jr. et al. | 118/725 |
| 4,613,522 | 9/1986 | Vasilos | 427/202 |
| 4,668,579 | 5/1987 | Strangman et al. | 428/367 |

FOREIGN PATENT DOCUMENTS 0380375 1/1989 European Pat. Off.

Primary Examiner—Roy King
Attorney, Agent, or Firm—George W. Moxon, II; Teresan W. Gilbert

[57] ABSTRACT

A glassy coated sintered non-oxide ceramic fiber produced by an in situ oxidation chemical reaction. A process to produce a protective glassy coating on ceramic fibers by heating the non-oxide ceramic fibers in the presence of boron and atmosphere containing oxygen.

16 Claims, No Drawings

PROTECTIVE COATING FOR NON-OXIDE SINTERED FIBERS GENERATED BY IN SITU CHEMICAL REACTION

BACKGROUND OF THE INVENTION

The invention relates to a process to produce an in-situ generated glassy coating on a non-oxide sintered ceramic fiber such as silicon carbide, boron carbide, or titanium boride. The coated fibers produced by the process in the case of sintered non oxide fibers, this invention have high tensile strength.

Non-oxide ceramic materials have high performance potential and are being used for high temperature advanced composites and insulation. However, silicon carbide fibers and other non-oxide ceramic fibers are susceptible to surface damage during processing causing a decrease in the fibers performance and tensile strength. The surface damage is generally seen as surface irregularities and in the case of sintered non-oxide fibers, protruding grains which are strength limiting to the fibers.

Tensile properties of glass and other ceramic fibers have generally been improved by applying an organic spin finish after forming and prior to contact with other fibers in a bundle or tow. The spin finish is designed to prevent formation of minute scratches and other contact type defects to the fibers. This method is not desirable for green non-oxide ceramic fibers that are to to be sintered because the finish would burn off during sintering.

There is a need to improve the performance and tensile strength of non-oxide ceramic fibers if they are to be used to their fullest potential. It is desirable to find a way to increase the strength and performance of sintered non-oxide ceramic fibers by coating the fiber.

It is object of the instant invention to produce a protective coating for non-oxide sintered fibers generated by an in situ chemical reaction. It is another object of the instant invention to improve the performance of sintered non-oxide ceramic fibers by coating the fiber with a glassy coating to fill in the surface irregularities and improve the strength and performance of the fiber.

DEFINITION

The term "fiber" is used herein to mean a shaped article having a length several orders of magnitude greater than its diameter. "Green Fiber" is used herein to mean one which has not yet been sintered.

SUMMARY OF THE INVENTION

The invention includes a glassy coated non-oxide sintered ceramic fiber and an in situ chemical reaction process to produce it.

The invention includes a process for coating non-oxide sintered ceramic fibers comprising heating sintered non-oxide ceramic fibers in the presence of boron at a temperature in the range from about 600° C. to less than 1400° C. for a time sufficient to generate a glassy coating by an oxidation chemical reaction.

In accordance with the instant invention a glassy coating is uniformly deposited in situ on a sintered non-oxide ceramic fiber. The glassy coated non-oxide ceramic fiber has improved strength and performance properties. The glassy coating on the non-oxide ceramic fiber prevents damage in the processing and handling of the fiber and also heals surface defects. The glassy coating fills in surface irregularities and improves the strength of the non-oxide ceramic fibers.

The high strength non-oxide ceramic fibers of this process are useful as reinforcing agents in structural materials such as plastics, metals, ceramics, glass, glass ceramics, polymers and other materials.

DETAILED DESCRIPTION OF THE INVENTION

In order to achieve the objects of the present invention, there is provided a method for producing an in situ protective coating on a sintered non-oxide ceramic fiber. The method comprises heating a sintered non-oxide ceramic fiber in the presence of boron at a temperature and time sufficient to cause a glassy protective coating on the fiber.

The glassy coating is formed in situ by heating the sintered non-oxide ceramic fiber in the presence of boron at a temperature in the range of about 600° C. to less than 1400° C., preferably about 800° C. to about 1000° C. The time is dependent upon temperature and the desired thickness of the glassy coating and is generally in the range from about 1 minute to about 2 hours and preferably from about 5 minutes to about 1 and a quarter hours.

The glassy coating is generated by a chemical reaction, in particular an oxidation reaction. Oxygen needs to be present in a sufficient amount to oxidize the surface of the fibers. The atmosphere must contain oxygen and may contain other materials such as hydrogen; nitrogen; carbon dioxide; carbon monoxide; inert or noble gases such as helium, neon, argon; krypton, xenon and radon; air; water vapor and the like. The oxygen containing gas is preferably oxygen or air.

The glassy coating is formed from sources, compounds and/or materials containing boron. Materials suitable for conversion and the production of the protective glassy coating from the boron include but are not limited to boron, boron carbide, boric oxide, borates, borosilicates, boron nitride, borides, boranes and the like. The preferred sources of boron are boron carbide, boric oxide and combinations thereof. The glassy coating typically is a borate glassy phase on the non-oxide ceramic fiber. The borate glassy phase may contain glass forming constituents.

The boron containing material is deposited on the fiber and reacts with the fiber material to produce an oxidation reaction product. For example, if the source of boron is $B_2O_3$ and the fibers are SiC the boron oxide is deposited on the SiC fibers and reacts to form a B-Si-Ox glass coating.

The boron can come from boron in the fiber itself and/or boron external to the fiber such as boron in the vessel where the in situ oxidation chemical reaction takes places. External sources of boron may include but are not limited to boron, boron compounds, sintered silicon carbide containing boron, equipment and materials in the vessel containing boron and the like. The source and amount of boron must be sufficient to generate an oxidation product and be available to the fiber during the reaction so that while the coating is being formed on the fiber the boron is not depleted. The amount of boron further depends on the desired thickness of the protective glassy coating. It is theorized that if the boron source is from the fiber itself, the boron spreads out, wets and adheres to the fiber and if the boron source is external from the fiber, the boron vaporizes, wets and then adheres to the fiber on condensation.

The glassy boron coating fills up small surface defects in the fiber surface, such as craters. These are the portions of the fiber surface that need to be coated so as to provide a smooth surface. The thickness of the coating should be sufficient to fill up the space and defects between the grains exposed to the surface. The surface roughness of the fiber is generally less than the average grain size of the fiber and the typical fiber grain size is equal to or less than 5 microns and preferrably equal to or less than 1 micron. The thickness of the coating in relation to grain size is generally about 1/10 the grain size of the fiber. A glassy protective layer adhered to the surface of the fiber generally has a thickness in the range from about 10 A to about 15,000 A thick.

The fibers produced by the process of this invention typically have a tensile strength of at least 100,000 pounds/square inch (psi) and more preferably at least 200,000 psi.

The ceramic fibers of the instant invention are sintered from uncoated non-oxide ceramic powders. The fiber usually comprises a boride, carbide, nitride or silicide of a different element, i.e. other than silicon when the compound is a silicide, and boron when the compound is a boride, selected from aluminum, boron, chromium, hafnium, molybdenum, niobium, silicon, tantalum, titanium, tungsten, vanadium and zirconium.

Suitable ceramic powders include but are not limited to powders selected from the ceramics of the group $B_4C$, $HfC$, $NbC$, $SiC$, $TaC$, $VC$, $WC$, $ZrC$, $CrB_2$, $HfB_2$, $NbB_2$, $TaB_2$, $TiB_2$, $VB$, $WB$, $ZrB_2$, $AlN$, $HfN$, $NbN$, $Si_3N_4$, $TaN$, $TiN$, $VN$, $ZrN$, $Mo_5Si_3$, $MoSi_2$, $ZrSi$ and mixtures thereof.

Particularly desirable ceramics are titanium diboride ($TiB_2$), silicon carbide (SiC), aluminum nitride (AlN) and boron carbide ($B_4C$). These materials have been found to be sinterable in accordance with the process disclosed in U.S. patent application Ser. No. 074,080 entitled "Non-Oxide Sintered Ceramic Fiber, now U.S. Pat. No. 4,908,340. The fibers consists essentially of non-oxide ceramic materials, i.e. greater than 90% and preferably greater than 95% non-oxides.

The sintering methods to produce the non-oxide ceramic fibers can be any conventional method such as those described in U.S. Pat. No. 4,123,286. The sinterable fibers may be formed by melt spinning, suspension spinning, blowing or by centrifugal spinning as subsequently described.

In melt spinning, the silicon carbide, sintering aids, and organic compounds including polymers, plasticizers, and dispersants are melt blended. The blended components are then desirably pelletized and the pellets are melt spun by extrusion. The resulting continuous sinterable fibers are collected.

In the case of suspension spinning, the silicon carbide powder and sintering aids are milled or mixed with the organic constituents with sufficient diluent to form a suspension. The resulting suspension is then spun and dried.

Sinterable fibers may also be made in random sizes by blowing or by centrifugal spinning. In this case, the components are blended together in a manner similar to suspension spinning except that the resulting blend is utilized in an apparatus for blowing fibers or in a centrifugal spinner.

The fibers may either be sintered before they are fabricated or they may be sintered subsequent to fabrication of other products. The sintering temperature for the ceramic powder usually ranges between about 1700° C. to about 3000° C. depending upon the ceramic system utilized. When the ceramic is silicon carbide the sintering temperature more specifically ranges between about 2000° C. to about 2300° C. The sintering time varies according to the temperature and size the fibers and is generally from about 0.2 to about 90 minutes and preferably from about 0.5 to about 20 minutes. After the non-oxide ceramic fibers are sintered, they are coated according to the process of the instant invention.

The fibers of the present invention are particularly applicable as reinforcements since a particular non-oxide ceramic can be selected to obtain a desirable coefficient of thermal expansion to match the material being reinforced.

Specific Embodiment

The following examples illustrate the process in accordance with this invention to produce an in situ glassy protective coating on sintered non-oxide ceramic fibers which improves the strength of the fiber. The following examples demonstrate, but do not limit the instant invention.

EXAMPLE 1

This example shows the preparation of the sintered non-oxide ceramic fibers composition for the glassy coating experiments:

| | |
|---|---|
| Silicon Carbide (SiC) Powder (available from Showa Denko) SA (surface area) 18-21 m²/g Avg. P.S. (particle size) 0.4 um | 600.0 g |
| Polyethylene oxide (MW 900,000) | 76.5 g |
| Acetone | 972.0 g |
| Boron Carbide | 3.0 g |

The above ingredients were placed in a 1 gal. jar mill containing approximately 10 lbs. of SiC milling media and the mixture was milled for about 24 hours. The resulting slurry was discharged into a 2000 ml reaction kettle equipped with stirrer and heating jacket. About 29.6 g novolac A stage phenolic resin was dissolved by stirring in about 100 ml ethanol and about 50 ml acetone which was then added to the slurry. When the novolac addition was complete about 25 ml of distilled water was added to the slurry. Stirring was continued and the temperature raised to approximately 50° C. to 55° C. A vacuum was then applied through a condensing cold trap to remove excess solvent. When the mixture reached a solids content of about 55% to 60% by weight, it was removed from the kettle and placed in a fiber spinning system equipped with a spinneret containing 20 holes, each about 0.008 inch diameter. The extruded fibers were taken up on a rotating drum at a speed of about 40 ft/min. The green fibers were then removed from the drum and hangfired in a periodic furnace at about 2150° C. in argon for about 30 minutes.

The fibers produced in this manner exhibited grainy surface appearance when magnified at 1000X by a SEM microscope (Amray, Model AMR 1400). The tensile strength of the fiber was measured by break load measurements and averaged about 85,000 psi.

EXAMPLE 2 (Oxidation Coating on SiC Fibers)

The sintered SiC fibers obtained from Example I were oxidatively coated in situ with a glassy protective coating in the following manner: A supporting fixture consisting of a sintered SiC base plate with two narrow boron nitride (BN) strips placed on opposite edges was set up to hold the fibers. An array of single spaced fibers was straddled over the SiC plate using the BN strips to support the fiber ends so that no direct contact was made with the SiC plate. The assembly was then placed in a lab muffle furnace which was preheated to about 950° C. in air. After about 30 minutes the fibers were removed. Visually, the fibers appeared glossy black indicating that a glassy coating had been deposited. Confirmation of the coating was made by SEM photographs at 1000X. Tensile strength of the coated fiber was measured by break load measurement and averaged about 134,000 psi.

EXAMPLE 3 (Oxidation Coating on AlN Fibers)

The AlN fibers produced for coating experiments were prepared by mixing the following in a Brabender Plastograph:

| | |
|---|---|
| AlN (micronized with 1% $Y_2O_3$) | 83.0 g |
| Petrolatum | 14.0 g |
| Polyethylene (FN 510, available from U.S. Industrial Chemicals) | 5.5 g |
| Polyethylene (GUR 412, available from Hoechst Plastics) | 2.0 g |
| Corn Oil (generic) | 1.5 g |

Mixing was carried out at 160° C. for 30 minutes. The mixture was removed from the Plastograph and placed in a fiberizing apparatus containing a single 0.020 inches diameter orifice. The extruded fibers were drawn down to 0.005 inches and collected on a rotating drum. The fibers were removed by cutting along the axis of the drum. The bundle of fibers was placed on a graphite plate and sintered in $N_2$ at about 1850° C. for about 90 minutes. The sintered fibers appeared dull gray in color.

The sintered fibers were then placed on a supporting fixture consisting of a SiC base plate with 2 narrow BN strips located on opposite edges. The fibers were straddled over the SiC plate using the BN strips to support the fiber ends and to prevent direct contact with the SiC plate. The mounted fibers were then placed in a laboratory muffle furnace preheated to about 1100° C. in air. After about 16 hours the fibers were removed. Microscopic examination at 1000 X (Amray SEM) revealed the formation of a coating and the appearance changed from dull gray to a shiny black.

EXAMPLE 4 (Oxidative Coating on $TiB_2$ Filaments)

Sintered $TiB_2$ filaments were prepared in the following manner:

| | |
|---|---|
| $TiB_2$ (micronized powder) | 115.44 g |
| Petrolatum | 14.14 g |
| Polyethylene (FN 510, available from U.S. Industrial Chemicals) | 6.98 g |
| Polyethylene (GUR 412, available from Hoechst Plastics) | 4.65 g |
| Corn Oil (generic) | 2.5 g |

The above listed ingredients were mixed in a Brabender Plastograph at about 160° C. for about 1 hour. The mixture was removed from the mixer and placed in a fiberizing apparatus containing a single 0.020 inches diameter orifice which was preheated to about 180° C. in air. A pressure of about 608 psi was applied. The extruded fiber was drawn down to 0.005 inches and collected on a rotating drum. The fiber was removed by cutting along the axis of the drum. The bundle of fibers was placed in a graphite boat and sintered in argon at about 2150° C. for about 30 minutes.

The sintered fibers were then placed on a supporting fixture consisting of a sintered $SiC/TiB_2$ alloy base plate with two narrow BN strips located on opposite edges. The portion of the $SiC/TiB_2$ plate between the BN strips was lightly covered with $B_2O_3$ powder. The $TiB_2$ fibers were straddled over the $SiC/TiB_2$ plate using the BN strips to support the fiber ends and to prevent direct contact with the $B_2O_3$ powder on the plate. The mounted fibers were then placed in a laboratory muffle furnace preheated to about 900° C. in air. After about 45 minutes the fibers were removed. Microscopic examination at 1000X (Amray SEM) revealed the formation of a coating. Measurements taken on 4 fibers before and after the furnace treatment indicated the average coating thickness was 8.3 microns.

COMPARATIVE EXAMPLE A

Example A is presented to show the effect of oxidation in a boron free environment. A bundle of fiber weighing about 0.05 g was sintered as described in Example 2 and was placed in a quartz boat using $Al_3O_3$ blocks to support the fiber ends so that no contact was made with the quartz. The assembly was placed in a pre-heated lab muffle furnace at about 950° C. in air. After about 30 minutes nothing was apparent on the fibers so oxidation was continued. After about one hour the fibers were removed. No visual changes were apparent and the weight change of the fibers were negligible. The fibers were examined by SEM at 1000X which showed the fibers were uncoated and remained essentially in the same condition as they were when removed from the sintering furnace.

EXAMPLE 5 (Analysis of the glassy Surface coating of the fiber)

A series of SiC fibers were submitted for analytical analysis. The procedure was as follows:

The samples used were SiC fibers heated to about 1000° C. for about 1.25 hrs. in the presence of $B_2O_3$ and SiC fibers heated to about 1400° C. for about 1 hr. in the presence of $B_2O_3$.

The samples were analyzed on a PHI 660 SAM (Scanning Auger Microprobe) using a 3 KV electron beam and the samples were held at a 60° angle to minimize charging. The SEM (Secondary Electron Microscope) micrographs were also acquired on this instrument.

XPS (X-Ray Photoelectron Spectroscopy) analysis was done on the 1000° C. treated fibers using a PHI 5400 XPS instrument with 300 watt Mg X-rays, medium resolution and aperture 3. A survey scan was taken to identify any trace elements. The regions scanned included silicon, carbon, boron and oxygen. Atomic concentrations were calculated for each of the elements.

SIMS (Secondary Ion Mass Spectrometry) images and depth profiles were acquired of the fiber samples on a Cameca IMS-3F. The fibers were pressed into indium foil, Au coated and analyzed. The SIMS data was acquired with a 200 nA, 14.5 kV, O-sputtering beam which analyzed for positive secondary ions. SIMS images of B and Si were taken of the coated fibers. The image fields were 150 um in diameter with ca, 1 um lateral resolution. SIMS depth profiles were made by analysis of a small area (8 um) relative to the fiber diameters (100 um) while eroding away the fiber with a sputtering ion beam. The depth scales on the depth profiles were obtained from estimated sputter rates derived from B glass.

ICP (Inductively Couples Plasma) analysis was done with a JY-48 ICP. The coatings on the fibers were removed with HF and analyzed with ICP to obtain B/Si ratios by weight.

Results of the analytical analysis of the glassy surface coating on the fiber

The results of the analytical analysis for the glassy coated silicon carbide fibers heated to about 1000° C. are as follows: A SEM micrograph of the coated fiber at 1000X magnification demonstrates a uniformly coated fiber with small white "spots" dispersed over the entire surface of the fiber. SIMS images demonstrate distribution of the silicon and boron. A thin boron-oxide rich layer is present on the surface of the coatings with the boron and silicon distribution observed in the SIMS images lying underneath. The silica distribution is shown to be uniform over the fiber with inclusions of high boron concentration. The high boron areas are relatively low in silicon and correspond to the spots observed in the SEM micrograph. XPS analysis showed the following atomic percentage in the top 50 Å of the coating: silicon 6%, carbon 24%, boron 21%, oxygen 49%. XPS further showed that the silicon and boron present in the surface coating were in oxidized forms. ICP analysis demonstrated the B/Si ratios of the bulk coatings to be 0.5 by wt. The coated silicon carbide fibers were found to have B-Si-Ox coating of about 0.5 micron thickness.

The results of the analytical analysis for the glassy coated silicon carbide fibers heated to about 1400° C. are as follows: SEM micrographs of the coated fibers show rough and cracked surfaces with actual chunks of material peeling away.

The coated area running down the center of the fiber, was determined by Auger analysis to be primarily boron and oxygen with traces of silicon and carbon. In addition the cracked coating was found to be silicon oxide and the rough surface beneath the cracked area was mostly carbon. SIMS analysis showed that boron and silicon are distributed in segmented areas consistent with the Auger/SEM analysis. High boron areas are relatively low in silicon and high silicon areas are relatively low in boron. ICP analysis determined the B/Si ratios of the bulk coating to be 0.6 by weight. The thickness of the boron containing area ranged from about 1000 Å to greater than 12000 Å.

Discussion of analytical analysis of glassy surface coating on the fiber: The analytical analysis demonstrates that there is a reaction taking place between the $B_2O_3$ and the SiC fibers. Boron oxide, is deposited on the SiC fibers and reacts to form a B-Si-Ox glass. Further, there are boron rich white "spots" found on the SiC fibers.

Although the invention has been described in detail through the preceeding examples, these examples are for the purpose of illustration only, and it is understood that variations and modifications can be made by one skilled in the art without departing from the spirit and the scope of the invention.

What we claim:

1. A process for coating a non-oxide sintered ceramic fiber comprising heating the sintered non-oxide ceramic fiber selected from the group consisting of a boride, carbide, nitride or silicide of a different element selected from the group consisting of aluminum, boron, chromium, hafnium, molybdenum, niobium, silicon, tantalum, titanium, tungsten, vanadium, zirconium and combinations thereof in the presence of boron, in an atmosphere containing oxygen and at a temperature in the range from about 600° C. to about 1600° C. for a time sufficient to generate a glassy coating by an oxidation chemical reaction.

2. The process of claim 1 wherein the reaction occurs in an atmosphere selected from the group consisting of air and pure oxygen.

3. The process of claim 1 wherein said oxygen containing atmosphere contains gases selected from the group consisting of oxygen, hydrogen, nitrogen, carbon dioxide, carbon monoxide, inert and noble gases and combinations thereof.

4. The process of claim 1 wherein the boron is selected from the group consisting of boron, boron carbide, boron oxide, borate, borosilicate, boron nitride and combinations thereof.

5. The process of claim 1 wherein the boron is selected from the group consisting of boron carbide, boron oxide, borosilicate and combinations thereof.

6. The process of claim 1 wherein the source of boron is external to the non-oxide ceramic fiber.

7. The process of claim 1 wherein the non-oxide ceramic fiber contains the source of boron.

8. The process of claim 1 wherein the thickness of the glassy coating is less than or equal to 1/10 the grain size of the fiber.

9. The process of claim 1 wherein the thickness of the glassy coating is less than or equal to 1/10 of the grain size of the fiber and wherein the grain size of the fiber is less than or equal to 5 micron.

10. The process of claim 1 wherein the thickness of the glassy coating is less than or equal to 1/10 of the grain size of the fiber and wherein the grain size of the fiber is less than or equal to 1 micron.

11. The process of claim 1 wherein the ceramic fibers are selected from the group consisting of titanium boride, silicon carbide, boron carbide and aluminum nitride.

12. The process of claim 1 wherein the oxidation chemical reaction occurs at a temperature in the range from about 800° C. to about 1000° C.

13. The process of claim 1 wherein the oxidation chemical reaction is in the range from about 1 minute to about 1 hour.

14. The process of claim 1 wherein the oxidation chemical reaction is in the range from about 5 minutes to about 30 minutes.

15. The process of claim 1 wherein the thickness of the glassy coating is in the range from about 10 Å to about 15000 Å.

16. The process of claim 1 wherein the thickness of the glassy coating is in the range from about 1000 Å to about 12000 Å.

* * * * *